United States Patent [19]
Vincent

[11] Patent Number: 6,069,645
[45] Date of Patent: May 30, 2000

[54] METHOD AND APPARATUS FOR CONTROLLING DOT SIZE IN IMAGE FORMING APPARATUS HAVING AN ARRAY OF LASERS

[75] Inventor: Kent Vincent, Cupertino, Calif.

[73] Assignee: Hewlett-Packard Company, Palo Alto, Calif.

[21] Appl. No.: 08/332,187

[22] Filed: Oct. 31, 1994

[51] Int. Cl.[7] ................ B41J 2/47; B41J 2/435; G02B 26/02; G03B 27/72
[52] U.S. Cl. ............................................. 347/246
[58] Field of Search .................... 347/247, 246, 347/236; 372/23; 358/461, 456, 296, 298; 359/197–226; 399/177–181; 430/363

[56] References Cited

U.S. PATENT DOCUMENTS

| | | |
|---|---|---|
| 4,553,033 | 11/1985 | Hubble, III et al. . |
| 4,686,425 | 8/1987 | Havel . |
| 4,695,884 | 9/1987 | Anastassiou et al. .............. 358/461 |
| 4,704,699 | 11/1987 | Farina et al. ...................... 347/232 |
| 4,796,265 | 1/1989 | Asada et al. . |
| 4,879,459 | 11/1989 | Negishi . |
| 5,016,027 | 5/1991 | Uebbing . |
| 5,153,609 | 10/1992 | Ando et al. ........................ 347/246 |
| 5,369,423 | 11/1994 | Hunter et al. . |

FOREIGN PATENT DOCUMENTS

| | | |
|---|---|---|
| 0544002 A1 | 6/1993 | European Pat. Off. ....... G03G 15/04 |
| 61-173572 | 8/1986 | Japan . |

*Primary Examiner*—John Barlow
*Assistant Examiner*—Raquel Yvette Gordon

[57] ABSTRACT

A method and apparatus to accurately control the size of the spots or dots produced by individual lasers within an array of lasers of an image scanning device is disclosed. The lasers are driven in accordance with image information indicating an image to be scanned onto the image bearing member. Output intensity feedback information from each of the lasers is obtained by monitoring an intensity output from each of the lasers. Using this feedback information, the driving energy values of the lasers are adjusted to overcome any unwanted nonuniformities or otherwise calibrated. The invention can also be implemented as an apparatus. Regardless of how the invention is implemented, an image scanning/forming apparatus utilizing the invention is able to scan or print with an array of lasers without being susceptible to streaks and other defects which otherwise occur during the printing or scanning of an image when all of the lasers do not function in a uniform and consistent manner.

3 Claims, 6 Drawing Sheets

METHOD AND APPARATUS FOR CONTROLLING DOT SIZE IN IMAGE FORMING APPARATUS HAVING AN ARRAY OF LASERS

BACKGROUND OF THE INVENTION

1. Field of the Invention

The present invention relates to image forming devices and, more particularly, to laser-based image scanning devices having a plurality of lasers.

2. Description of the Related Art

FIG. 1 is a schematic diagram of a laser beam scanning unit. The laser beam scanning unit 2 includes a surface emitting semiconductor laser array 4 having a plurality of light emitting lasers 6 two-dimensionally disposed thereon. The intensity of the laser beams produced by the lasers 6 is discretely controlled by a control unit 8. Laser beams emitted from the lasers 6 are collimated by a collimator lens 10 to produce laser beams with a predetermined beam diameter. The laser beams then strike a facet of a rotating polygon mirror 12 and are directed through an objective lens 14 and onto an image bearing member 16. The laser beams striking the image bearing member 16 form spots 18 along scan lines 20 produced by rotating the polygon mirror 12. Further, details on the laser beam scanning unit shown in FIG. 1 are described in European Patent Publication 0544002 A1.

Conventionally, the lasers within an array of lasers are all designed to have the same intensity output for a given driving voltage. However, when actual manufacturing of the semiconductor lasers takes place, differences in intensity performance occur among the lasers within the array. As a result, the lasers within an array will each have different intensity responses to a given driving voltage. The different intensity responses will result in a lack of uniformity among the lasers of the array. As a consequence, for a given applied driving voltage, the spots produced by the various lasers in the array will have different sizes. This causes image quality to suffer because precise control of spot size amongst an array of lasers is unavailable which makes streaks and other defects likely to occur in a scanned or printed image.

Thus, there is a need to precisely control the size of spots produced by an array of lasers.

SUMMARY OF THE INVENTION

Broadly speaking, the invention is a novel technique to accurately control the size of the spots or dots produced by individual lasers within an array of lasers. The advantage of such control is that the lasers within the array can be operated in an uniform and consistent manner, regardless of any physical, environmental or operational nonuniformities.

As a method, the invention controls an image scanning device having a plurality of lasers such that spots produced on an image bearing member are of a precisely controlled size. The method receives image information indicating an image to be scanned onto the image bearing member, and drives the lasers in accordance with the image information. Output intensity feedback information from each of the lasers is obtained by monitoring an intensity output from each of the lasers. Using this feedback information, the driving energy values of the lasers are adjusted to overcome any unwanted nonuniformities.

Another method implementation of the invention is primarily concerned with calibration of the lasers with an array of lasers for an image forming apparatus. The method drives the lasers at some predetermined level and receives output intensity data from a plurality of the lasers by monitoring the lasers using photodetector units. Then, the output intensity data from each of the plurality of lasers is compared with the rest of the plurality of lasers to produce comparison information. Based on the comparison information, the plurality of the lasers are then calibrated with one another.

The invention can also be implemented as an apparatus. An apparatus implementation of the invention includes an array of surface emitting lasers and a scanning system which combine to produce laser scan lines on the surface of an image bearing member. The apparatus also includes a monitoring means and a dot size control unit. The monitoring means operates to monitor intensity of each of the laser beams being produced by the array of lasers and to produce a feedback intensity value for each of the laser beams. The dot size control unit controls the size of the spots produced by each of the lasers by driving the lasers in accordance with the feedback intensity value associated therewith.

Regardless of how the invention is implemented, an image scanning/forming apparatus utilizing the invention is able to scan or print with an array of lasers without being susceptible to streaks and other defects which otherwise occur during the printing or scanning of an image when all of the lasers do not function in a uniform and consistent manner.

Other aspects and advantages of the invention will become apparent from the following detailed description, taken in conjunction with the accompanying drawings, illustrating by way of example the principals of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–6. However, those skilled in the art will readily appreciate that the detailed description given herein with respect to these figures is for explanatory purposes as the invention extends beyond these limited embodiments.

Figure 1:
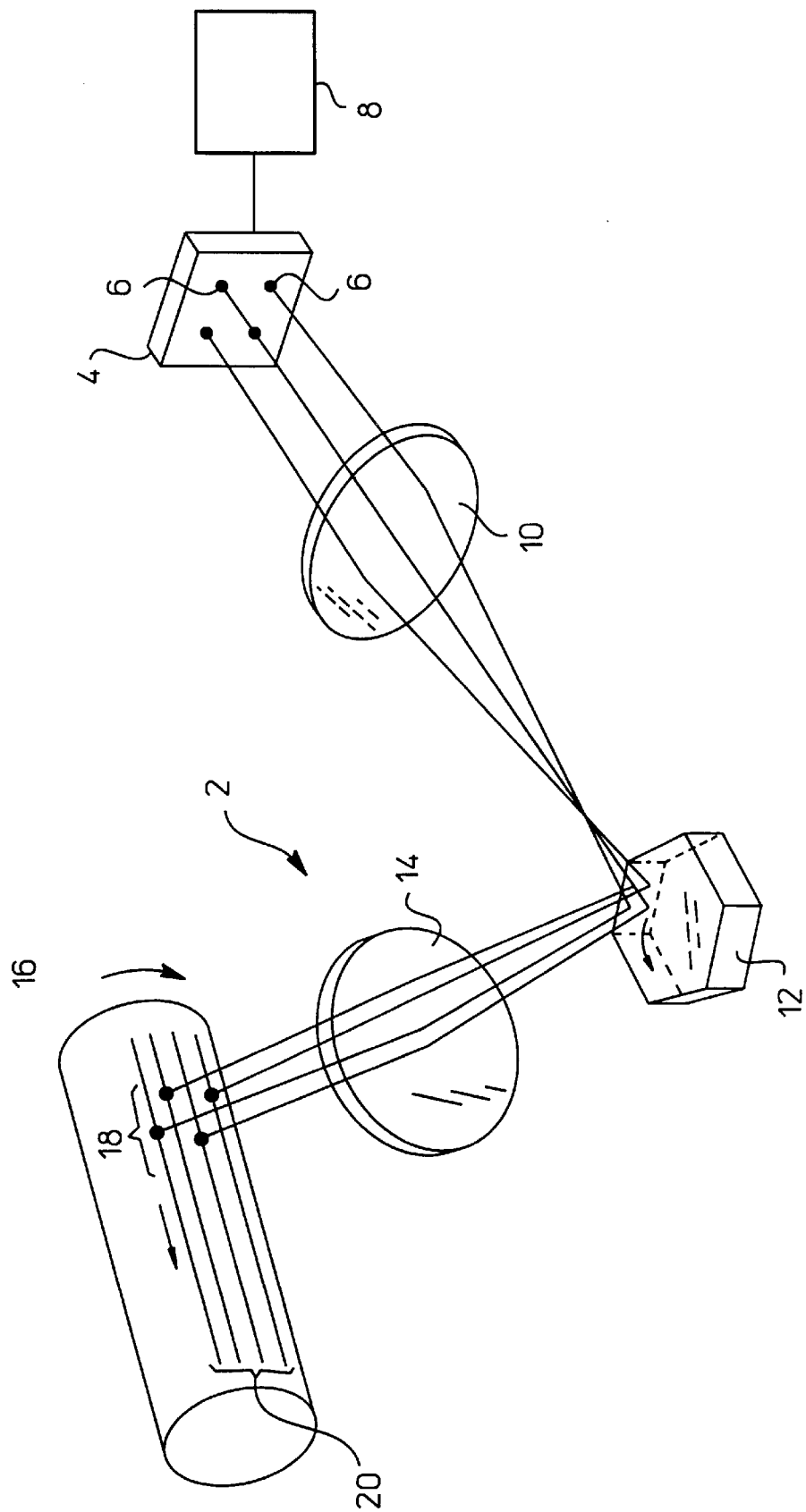
FIG. 1 is a schematic diagram of a conventional laser beam scanning apparatus.

The development of surface emitting lasers has facilitated the practicality of using a laser beam scanning device with an array of lasers such as illustrated in FIG. 1. The difficultly, however, with printing with an array of lasers is that such a printing device is susceptible to streaks and other defects which may occur during the printing or scanning of an image when all of the lasers do not function in a uniform and consistent manner. It has been observed that even when the lasers are formed on a single substrate, the intensity of light emitted for a given applied voltage can differ by as much as 50%. Not surprisingly, this lack of uniformity among lasers causes the printed image quality to suffer. The present invention overcomes this problem associated with prior art by monitoring the intensity output from each of the lasers and using this information to make adjustments to the driving voltage being applied to individual lasers.

Figure 2:
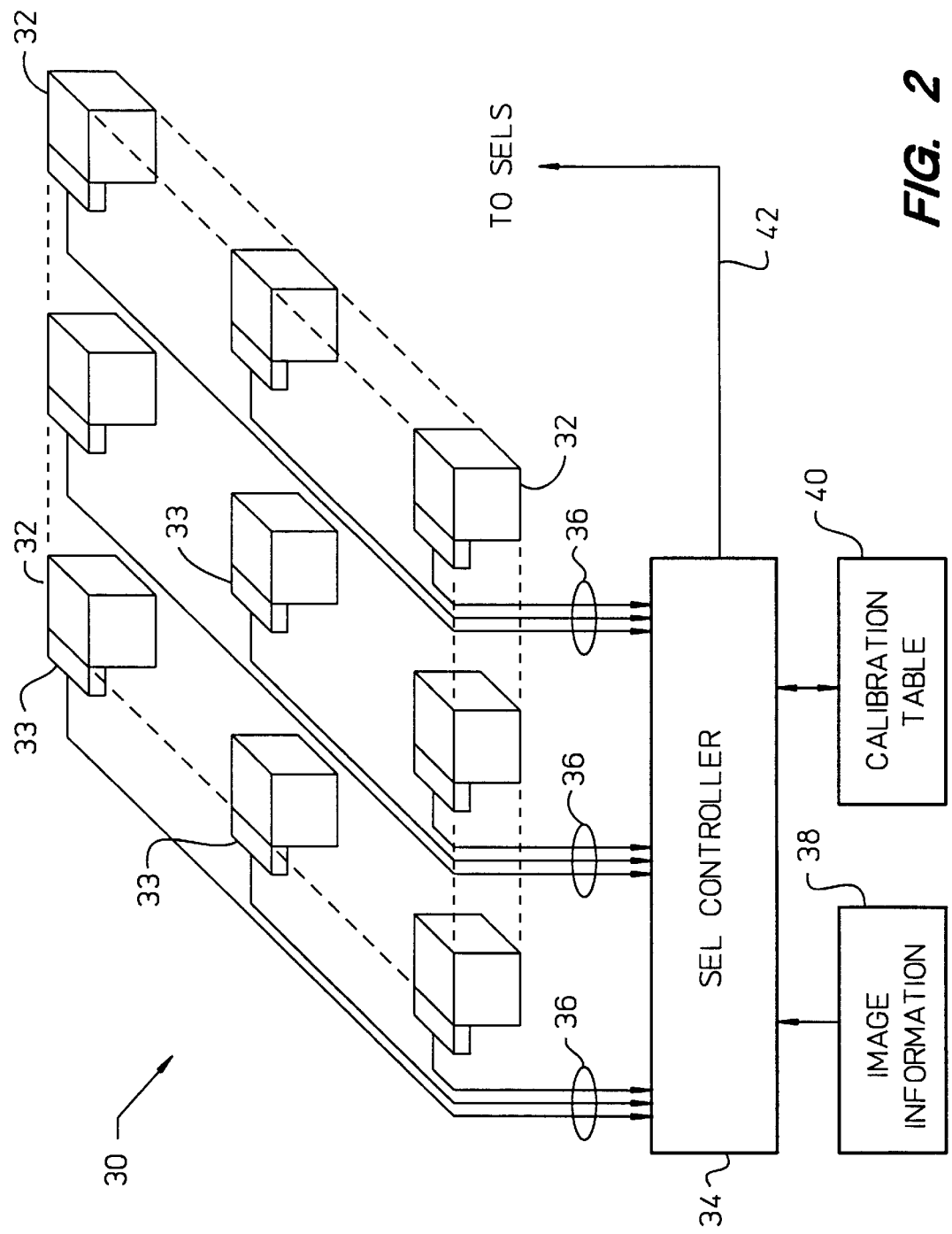
FIG. 2 is a block diagram of a laser beam scanning apparatus according to the invention.

FIG. 2 is a block diagram of a laser beam scanning apparatus 30 according to the invention. The laser beam scanning apparatus 30 includes an array of surface emitting lasers (SELs) 32. Each laser 32 within the array is individually controllable and capable of producing a laser beam. Each of the lasers 32 also has a photodetection unit 33 coupled thereto. Each of the photodetection units 33 provides intensity feedback information on the intensity of the laser beam being produced by the corresponding laser 32. The formation of the photodetection unit 33 for each of the individual lasers 32 is described in more detail below in FIG. 6.

The laser beam scanning apparatus 30 also includes a surface emitting laser (SEL) controller 34 which operates to discretely control the array of lasers 32. The SEL controller 34 receives real-time intensity feedback information from the photodetection units 33 associated with each of the lasers 32 via wires 36. The SEL controller 34 also receives image information 38 which directs the SEL controller 34 on the particular image to be printed. A calibration table 40 is also connected to the SEL controller 34. The calibration table 40 stores calibration information which is used by the SEL controller 34 to operate the array of lasers 32 in a uniform manner despite their physical differences. The physical differences of the array of lasers include, for example, variations in laser electrical resistance, laser aperture variations, responsiveness of active regions, and performance of Bragg reflectors. The SEL controller 34 produces SEL control signals 42 for the array of lasers 32 in accordance with the image information 38, the intensity feedback information and perhaps information from the calibration table 40.

The operation of the laser beam scanning apparatus 30 shown in FIG. 2 is described in more detail below with reference to FIGS. 3, 4A, 4B and 5.

Figure 3:
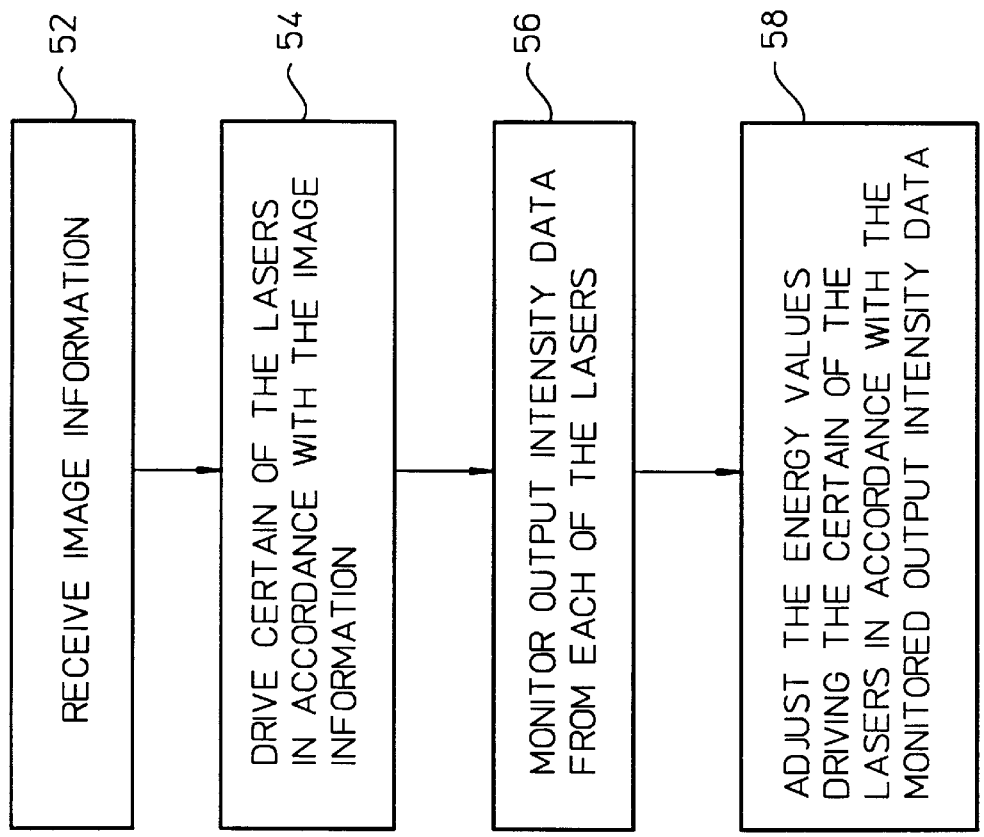
FIG. 3 is a flow chart of a first embodiment of a laser control method according to the invention.

FIG. 3 is a block diagram of a first embodiment of a SEL control method 50 according to the invention. The SEL control method 50 begins by receiving 52 the image information 38. The image information 38 details the image to be scanned or printed. Thereafter, certain of the lasers 32 are driven 54 in accordance with the image information 38. As the lasers 32 are being driven 54, output intensity data from each of the lasers 32 is monitored 56. The photodetection unit 33 shown in FIG. 2 is exemplary of a device which performs the monitoring function.

Using the known photoresponse characteristics of the image bearing member of the laser beam scanning apparatus 30, the SEL controller 34 determines a drive voltage amount in which to drive 54 certain of the lasers 32 so as to produce the desired spots on the image bearing member. When the monitored output intensity data values are different from those intended or expected, the drive voltage amounts used to drive the certain of the lasers 32 are adjusted 58 in accordance with the monitored output intensity data. The monitored output intensity values for the certain of the lasers 32 could deviate from their expected intensity for a number of reasons, including laser aperture variations, laser electrical resistance variations, laser temperature variations, or other physical or environmental variations. For example, if first and second lasers are to produce identical spots and the electrical resistance of these lasers differ, then driving the lasers with the same voltage will produce spots which are not identical. Hence, the invention adjusts the driving voltage supplied to the first and second lasers such that the laser which is less efficient (responsive) is driven at a greater voltage than the laser which is more efficient. Accordingly, this embodiment insures that the size of the spot produced by each of the activated lasers will be exactly the size of the spot requested or required by the image information, regardless of any physical or environmental differences between the lasers of the array.

Figure 4A:
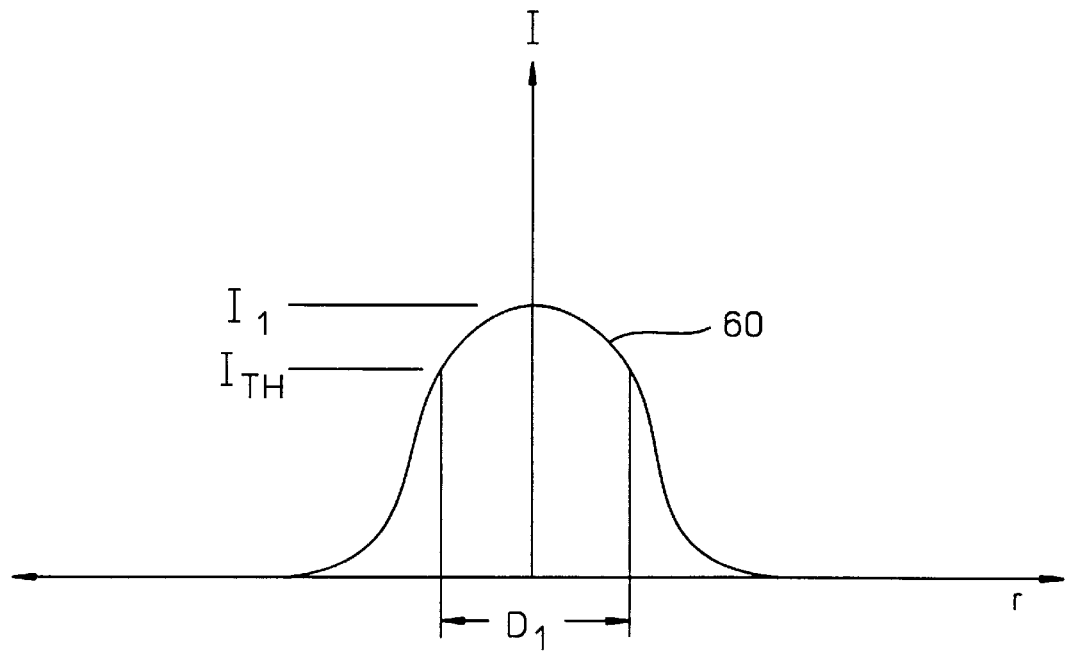
FIGS. 4A and 4B are diagrams of laser beam intensity profiles verses radius of the laser beam to explain differing dot sizes.
Figure 4B:
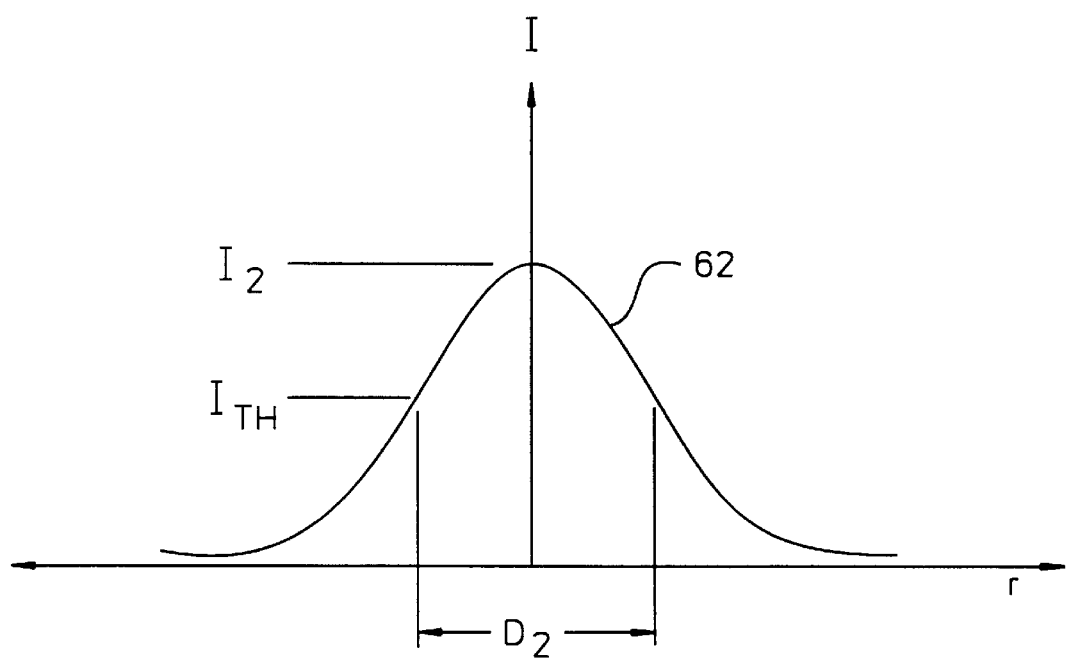

The diagrams of laser beam profiles verses radius of the laser beams shown in FIGS. 4A and 4B are used to explain how different dot sizes are produced. Generally speaking, the beam intensity impinging on an image bearing member of a laser beam scanning apparatus is of a substantially symmetrical gaussian profile. Hence, for a given laser beam, there will be a radius about the center of the beam within which the beam intensity is sufficient to discharge the photoconductor associated with the image bearing member, and beyond which the intensity is too low to sufficiently discharge the photoconductor for printing. The beam intensity which is sufficient to discharge the photoconductor is referred to as a threshold intensity ($I_{TH}$). In FIG. 4A, a spot of diameter $D_1$ is produced because the portion of intensity curve 60 exceeding $I_{TH}$ corresponds to a spot of diameter $D_1$. Similarly, in FIG. 4B, a dot of diameter $D_2$ is produced because the portion of intensity curve 62 exceeding $I_{TH}$ corresponds to a spot of diameter $D_2$. Consequently, as the laser beam is increased in intensity, the radius of the spot produced increases, and as the laser beam is decreased in intensity, the radius of the size of the spot decreases.

Since the photodetection unit 33 allows precise control of the beam intensity of each laser 32, the size of the spot produced on the photoconductor can be precisely controlled once the discharge characteristics of the photoconductor are known. In practice, the relationship between scanned spot size (or printed dot size) and laser intensity are known and can be stored digitally in the memory of a printer or other laser beam scanning apparatus. As image information (e.g., grayscale data) is fed into the scanning apparatus (printer), the value for each pixel can be converted to laser intensity using a table. Then, during scanning (or printing), the driving voltages for the lasers can be adjusted so that the intensity of the lasers matches the intensity required to produce the spot of the size desired. This technique is advantageous over conventional binary grayscale imaging techniques, e.g., error diffusion, dither and super pixeling, because the gray scale value is not spread over adjacent pixels but is controlled accurately at each pixel to maintain image sharpness.

Figure 5:
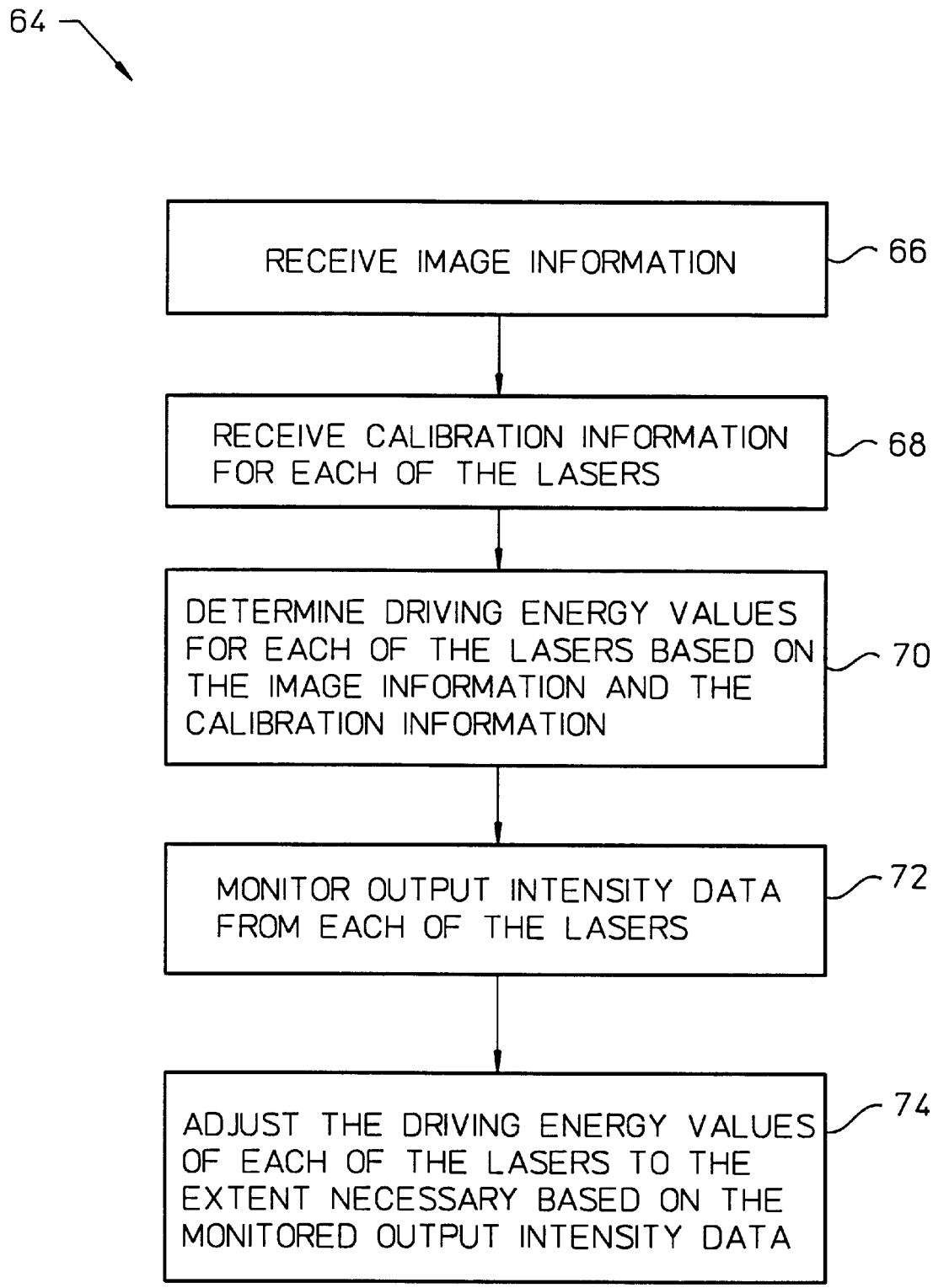
FIG. 5 is a flow chart of a second embodiment of a laser control method according to the invention.

FIG. 5 is a flow chart of a second embodiment of a laser control method according to the invention. In this embodiment, the adjusting is done in two stages. In a first stage, the lasers are calibrated against one another to provide uniform operation despite physical differences between the lasers. Typically, this first stage would be performed at the factory. Then, in a second stage, the lasers are monitored and adjusted in real-time to compensate for an other nonuniformities.

The laser control method 64 begins by receiving 66 the image information 38. A factory calibration would already have been performed. Hence, before scanning or printing, the laser control method 64 would have received 68 calibration information for each of the lasers 32. The calibration information quantifies the relationship between driving voltage and resulting intensity for each of the lasers. Hence, the calibration information relates to a drive voltage-to-intensity profile for each of the lasers. As an example, the calibration information could be obtained by driving all the lasers 32 with a predetermined fixed voltage and then recording the resulting intensity values using the photodetection units 33. The number of points of comparison needed for calibration over the operating intensity range of the lasers 32 will depend on how linear the relationship between output intensity and applied voltage are. In any case, the calibration information can be stored in the calibration table 40 as shown in FIG. 2.

Next, the SEL controller 34 determines 70 a driving energy value needed for each of the lasers to produce the desired information. These driving energy values are determined 70 based on the image information 38, the calibration information, and the known photoresponse characteristics of the image bearing member. The image information 38 and the photoresponse characteristics of the image bearing member are used to determine the intensity of the spot to be produced by a laser at a given point of time. The calibration information is then used to determine the driving voltage needed to obtain the intensity needed. Hence, by using the calibration information, the SEL controller 34 is able to drive each of the lasers in a different, although consistent, manner so that the laser-to-laser intensity or resulting spot size would be adjusted to compensate for physical differences in the output efficiency of the lasers 32.

Further, as the lasers 32 are being driven by the determined driving energy values, the SEL controller 34 monitors 72 the output intensity data from each of the lasers 32 in real-time. Using this real-time output intensity data, the SEL controller 34 adjusts 74 the driving energy values being supplied to each of the lasers 32 to the extent necessary so as to compensate for environmental, operational or physical nonuniformities. An example of a environmental nonuniformity is ambient temperature which can have an effect on the intensity of the laser beams produced for a given driving voltage. An example of an operational nonuniformity is the relative temperature of the various lasers, laser which have been continuously printing will be hotter than those which have been printing intermittently. All other variables being equal, a hot laser will produce a different intensity output than will a cold laser. This differing output results because temperature variations impact the spectral alignment of the active and Bragg layers, and because the active layers are semiconductor layers which have a known sensitivity to temperature. Although the more substantial physical differences are compensated for by the calibration stage, operational variations or nonuniformities are also compensated for. Examples of operational nonuniformities include, for example, print duty cycle, laser temperature, ambient temperature and the like. Preferably, but not necessarily, these operational variations are compensated on a per laser basis since the print duty cycle and laser temperature of each laser is likely different. Print duty cycle relates to the amount of printing done by a laser just prior to the current printing. The more an individual laser is on for printing, the hotter it gets and, generally, the lower its power output.

Figure 6:
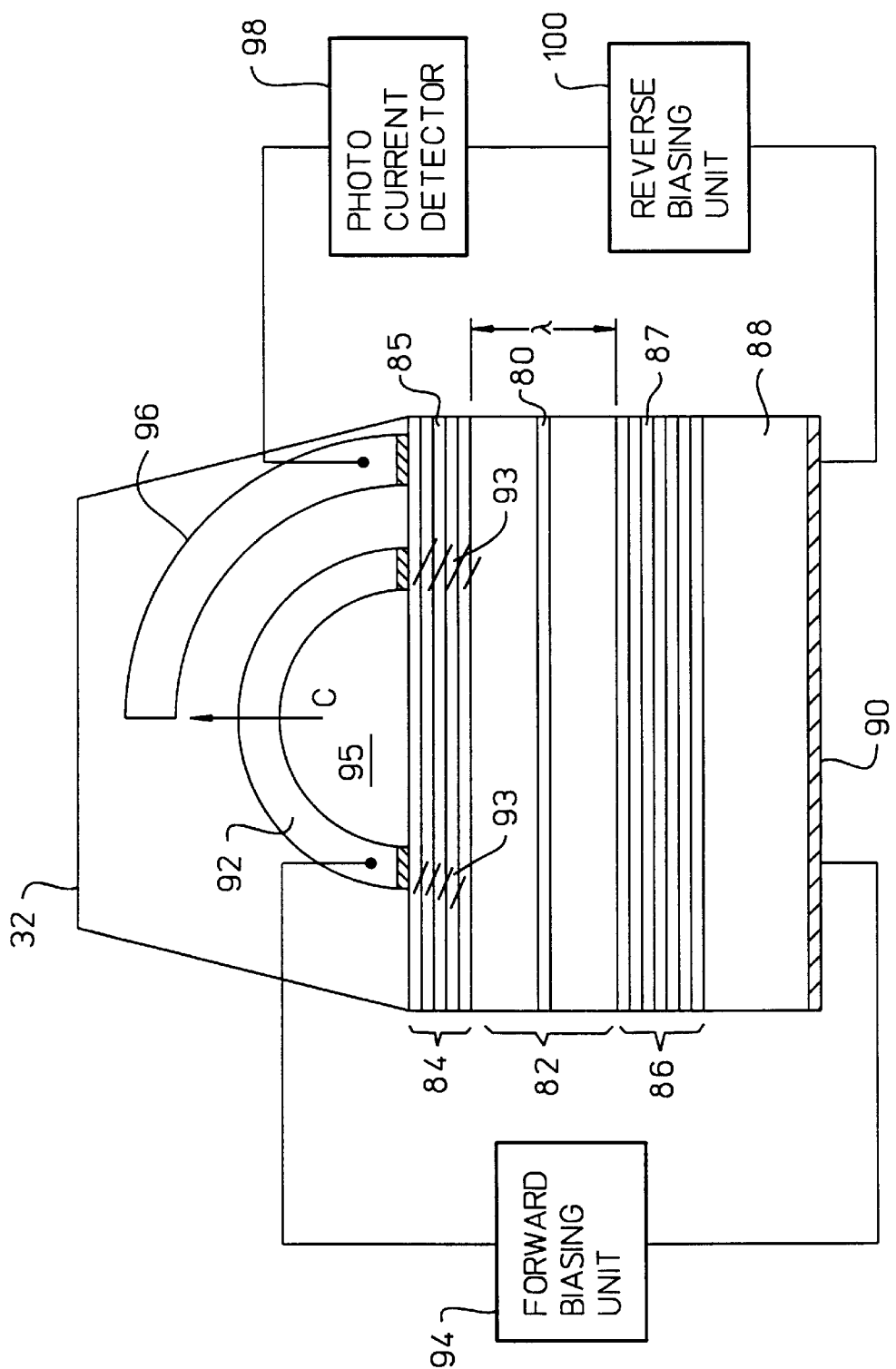
FIG. 6 is a diagram of a thin film construction of a surface emitting laser.

FIG. 6 is a cross-section of a thin film construction of a surface emitting laser 32. The surface emitting laser 32 is designed to emit light at a wavelength of $\lambda/m$, where mode m is an integer. The laser 32 comprises an active (photon generation) region 80 clad on each side by Bragg reflectors 84 and 86. The Bragg reflectors 84 and 86 consist of layers 85 and 87 of p-doped and n-doped material, respectively, to form a P-N junction across the active region 80. The Bragg reflectors 84 and 86 are a periodic structure of thin semiconductor or dielectric films with alternating refractive indices. Each of the layers 85 and 87 have an optical thickness of $\lambda/4$. The active region 80 is deposited central to an optical cavity 82 having an optical thickness $\lambda$. The cavity 82 is constructed from a relatively high or low refractive index material compared to the abutting layers of Bragg reflectors 84 and 86.

Light generated by the active region 80 is reflected by the various layers 85 and 87 of the Bragg reflectors 84 and 86 so that most of the light is reflected back into the cavity 82. Wave interference within the layers reduces the light to standing waves of wavelength $\lambda/m$. By designating Bragg reflectors 84 and 86 to be somewhat less than totally reflective, coherent light C of wavelength $\lambda/m$ is emitted perpendicular to the plane of the optical layers. By proper selection of layer materials and thicknesses, the emission of the laser can be reduced to a single longitudinal mode.

The entire structure for the laser 32 is deposited on a substrate 88. Metal electrodes 90, 92 and 96 are also deposited over the substrate 88 and the Bragg reflector 84. Electrodes 90 and 92 are used to electrically stimulate the laser. The electrodes 90 and 96 are used in measuring the intensity of the light produced by the laser, that is, the light emitted through the aperture of the laser.

The laser 32, shown in FIG. 6, is activated by forward biasing the electrode 92 with respect to electrode 90. This forward biasing is achieved by a forward biasing unit 92 depicted in FIG. 6. Typically, the forward biasing unit 92 is a DC voltage source with its positive potential connected to electrode 92 and its negative potential connected to electrode 90.

To obtain the feedback intensity information, the electrode 96 is reversed biased with respect to electrode 90. This reverse biasing is provided by a reverse biasing unit 100 which is also depicted in FIG. 6. The reverse biasing unit 100 may be a DC voltage source with its positive potential connected to electrode 90 and its negative potential connected to electrode 96. By reverse biasing the laser 32 in this manner, a small photocurrent is produced between the electrode 96 and electrode 90. The small photocurrent is produced by a small portion of the light produced by the active region 80 which, due to reflections, reflects laterally in the cavity 82 instead of vertically as substantially all of the light does. A photocurrent detector 98, which is coupled between electrodes 96 and 90, detects the level of photocurrent being produced. For example, the photocurrent detector 98 could be a resistor which would convert the detected current to a voltage. Experimentation has indicated that the small fraction of photons producing the current in their reverse biasing circuitry is essentially or roughly, linearly related to the intensity of the light C being emitted through the aperture 95.

Thus, the photodetection unit 33 (FIG. 2), in effect, includes part of the laser 32 itself (a current generating portion which produces the photocurrent that is related to the intensity) and additionally the circuitry (current detecting portion) coupled to electrode 96, namely the photocurrent detector 98 and the reverse biasing unit 100. Although all parts of the photodetection unit 33 are closely coupled to the laser, only the current generating portion of the photodetection unit 33 need be integral with the laser.

An exemplary SEL structure consists of 30.5 pairs of alternating AlGaAs and AlAs layers epitaxially grown by molecular beam epitaxy on a N-type GaAs wafer to form the inner bragg reflector 86. The active layer 80 is next deposited and comprises three to five quantum wells of either AlGaAs or GaAs. Next, 20 pairs of AlGaAs and AlAs layers to form the outer Bragg reflector 84. The alternating AlGaAs and AlAs layers are constructed in a graded short period super lattice to reduce electrical resistance and band offset across the layer interfaces, as is well known in the art. A region 93 of the Bragg reflector 84 directly below the metalized portion of the electrode 92 is proton bombarded to confine current and likewise photon generation to the region of the aperture of the laser 32. The electrode 92 is a ring p-type contact metalized electrode which is deposited on the outer Bragg reflector 84, and the electrode 90 is an n-type contact metalized electrode placed on the back of the n-type GaAs substrate 88.

There are many other ways to construct a surface emitting laser and to detect laser beam intensity besides the design shown in FIG. 6. The invention is not limited to using the particular structure shown in FIG. 6. Some additional approaches are described in a commonly owned U.S. patent application entitled "INTEGRATION OF PHOTODIODE WITH SURFACE EMITTING LASER," filed concurrently herewith, and which is hereby incorporated by reference.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for producing spots of a controlled size on an image bearing medium in a laser-based image forming apparatus having an array of lasers, said method comprising the steps of:
    (a) receiving image information indicating an image to be scanned onto an image bearing member;
    (b) driving a plurality of lasers in accordance with the image information;
    (c) obtaining output intensity feedback information by monitoring an intensity output from each of the plurality of the lasers;
    (d) adjusting driving energy values of the plurality of lasers in accordance with the output intensity feedback information; and
    (e) scanning the array of lasers onto the image bearing member to produce spots of a controlled size;
    wherein said step (d) comprises the substeps of:
        (d1) determining a desired intensity output value for at least one of the plurality of lasers based on the image information and photoresponse characteristics of the image bearing member;
        (d2) comparing the desired intensity output value for the at least one of the plurality of lasers with the monitored intensity output for the particular laser; and
        (d3) adjusting the driving energy value for the at least one of the plurality of lasers based on said comparing (d2) by increasing the driving energy value for the at least one of the plurality of lasers if the monitored intensity output is substantially below the desired intensity output and by decreasing the driving energy value for the at least one of the plurality of lasers if the monitored intensity output is substantially greater than the desired intensity output.

2. A method for calibrating an array of images for an image forming apparatus, said method comprising the steps of:
    (a) monitoring a plurality of the lasers using photodetector units to produce output intensity data;
    (b) comparing the output intensity data from each of the plurality of lasers with those of other lasers of the plurality of lasers, said comparing producing comparison information; and
    (c) produces calibration information by calibrating the plurality of lasers with one another in accordance with the comparison information;
    (d) receiving image formation indicating an image to be scanned onto the image bearing member;
    (e) thereafter driving the plurality of the lasers in accordance with the image information and the calibration information;
    (f) obtaining output intensity feedback information by monitoring an intensity output from each of the plurality of the lasers;
    (g) adjusting driving energy values of the plurality of lasers in accordance with the output intensity feedback information by increasing the driving energy value for the at least one of the plurality of lasers if the monitored intensity output is substantially below the desired intensity output and decreasing the driving energy value for the at least one of the plurality of lasers if the monitored intensity output is substantially greater than the desired intensity output; and
    (h) scanning the array of calibrated lasers onto the image bearing member to produce spots of a controlled size on an image bearing medium in the image forming apparatus.

3. An image forming apparatus, comprising:
    an image bearing member for forming an image thereon, said image bearing member having photoresponsive characteristics;
    an array of surface emitting lasers for producing light beams, each of the lasers producing a light beam, the array of lasers being operatively coupled to the image bearing member;
    monitoring means for monitoring intensity of each of the laser beams being produced by said array of lasers to produce a feedback intensity value for each of the laser beams, the monitoring means being operatively coupled to the array of lasers;
    a dot size control unit for controlling size of the dots produced by each of the lasers by driving voltage values of the lasers in accordance with the feedback intensity value associated therewith, the dot size controller being operativelt coupled to the array of lasers; and
    a scanning system disposed to utilize the light beams to produce a plurality of scan lines on the surface of said image bearing member, the scanning system being operatively coupled to the array of lasers, wherein said controller:
        increases the driving voltage value for at least one of the plurality of lasers if the monitored feedback intensity value is substantially below a desired intensity value; and
        decreases the driving voltage value for the at least one of the plurality of lasers if the monitored feedback intensity value is substantially greater than the desired intensity value.

* * * * *